United States Patent
Cheng et al.

(10) Patent No.: US 9,768,166 B1
(45) Date of Patent: Sep. 19, 2017

(54) INTEGRATED LDMOS AND VFET TRANSISTORS

(71) Applicant: INTERNATIONAL BUSINESS MACHINES CORPORATION, Armonk, NY (US)

(72) Inventors: Kangguo Cheng, Schenectady, NY (US); Juntao Li, Cohoes, NY (US); Geng Wang, Stormville, NY (US); Qintao Zhang, Mt. Kisco, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/275,587

(22) Filed: Sep. 26, 2016

(51) Int. Cl.
| H01L 21/336 | (2006.01) |
| H01L 27/088 | (2006.01) |
| H01L 29/78 | (2006.01) |
| H01L 29/08 | (2006.01) |
| H01L 29/66 | (2006.01) |

(52) U.S. Cl.
CPC ........ *H01L 27/088* (2013.01); *H01L 29/0873* (2013.01); *H01L 29/66666* (2013.01); *H01L 29/66681* (2013.01); *H01L 29/7817* (2013.01); *H01L 29/7827* (2013.01); *H01L 29/7833* (2013.01)

(58) Field of Classification Search
CPC ..... H01L 21/823487; H01L 21/823885; H01L 29/41741; H01L 29/66666; H01L 29/66712; H01L 29/66719; H01L 29/7802; H01L 29/7803; H01L 29/781; H01L 29/7812; H01L 29/7827; H01L 29/7833; H01L 29/7834; H01L 29/7835
See application file for complete search history.

(56) References Cited

U.S. PATENT DOCUMENTS

| 5,963,800 | A | 10/1999 | Augusto |
| 8,198,154 | B2 | 6/2012 | Hebert |
| 8,502,268 | B2 | 8/2013 | Yu |
| 9,041,127 | B2 | 5/2015 | Campi, Jr. et al. |
| 9,082,852 | B1 | 7/2015 | Liu et al. |
| 9,299,835 | B1 | 3/2016 | Anderson et al. |
| 2004/0070050 | A1 | 4/2004 | Chi |
| 2016/0141420 | A1 | 5/2016 | Chen et al. |
| 2016/0240623 | A1* | 8/2016 | Chang .................... B82Y 10/00 |

OTHER PUBLICATIONS

Merchant, S. et al. "Dependence of Breakdown Voltage in Drift Length and Buried Oxide Thickness in SOI RESURF LDMOS Transistors", 5th International Symposium on Power Semicondutor Devices IC's, 1993, pp. 124-128.
Patil, G. et al. "Asymmetric Drain Underlap Schottky Barrier SOI MOSFET for Lower-Power High Performance Nanoscale CMOS Circuits" IEEE Computer Society Annual Symposium on VLSI, 2011, pp. 43-48.

\* cited by examiner

*Primary Examiner* — Meiya Li
*Assistant Examiner* — Peter M Albrecht
(74) *Attorney, Agent, or Firm* — Cantor Colburn LLP; Vazken Alexanian

(57) ABSTRACT

Embodiments are directed to devices and methods for integrating laterally diffused metal oxide semiconductor (LD-MOS) technology on vertical field effect transistor (VFET) technology, which enables VFET applications to be broadened to include power amplifiers. By providing a combined asymmetric underlapped drain, high current, low subthreshold slope and LDMOS lightly doped drain, high drain resistance and high drain voltage are enabled.

20 Claims, 7 Drawing Sheets

US 9,768,166 B1

INTEGRATED LDMOS AND VFET TRANSISTORS

BACKGROUND

The present invention relates to integrated circuit chips, and more specifically, to a design structure for upside-down field effect transistors.

Integrated circuits (ICs) are implemented using a plurality of interconnected field effect transistors (FETs), which can be realized as metal oxide semiconductor field effect transistors (MOSFETs or MOS transistors). Various configurations of MOS transistors have been developed including, for example, vertical field effect transistors (VFETs) and laterally diffused metal oxide semiconductor (LDMOS) transistors.

SUMMARY

According to one embodiment, a semiconductor device is provided. The semiconductor device includes an LDMOS region including at least one fin, gate material in contact with the fin, a source and a drain contacting the ends of the fin, wherein the drain is a lightly doped drain coated with a heavily doped drain coating, a first spacer between a top surface of the metal gate and a bottom surface of the lightly doped drain; and a VFET region including at least one fin, gate material in contact with the fin, a source and a drain contacting the ends of the fin, wherein the drain is a heavily doped, a second spacer between a top surface of the metal gate and a bottom surface of the lightly doped drain, wherein the first spacer is thicker than the second spacer.

According to one embodiment, a method of forming a semiconductor device is provided. The method includes providing a first fin and a second fin in a dielectric layer, wherein each fin is in contact with a metal gate, wherein each fin contacts a source; etching the dielectric layer to create a first spacer above the metal gate in contact with the first fin and a second spacer above the metal gate in contact with the second fin, wherein the first spacer is thicker than the second spacer; applying a hard mask to the second fin; forming a lightly doped drain in contact with the first fin; removing the hard mask to expose a surface of the second fin; and forming a heavily doped drain in contact with the second fin.

BRIEF DESCRIPTION OF THE DRAWINGS

FIGS. 4-8 illustrate an exemplary fabrication process of forming a semiconductor device according to an embodiment, in which:

FIG. 4 illustrates a portion of the semiconductor device according to an embodiment illustrating the deposition of a top dielectric layer, followed by planarization to expose a top surface of the fins;

FIG. 5 is a cross-sectional view of the semiconductor device illustrating the etching the dielectric layer to expose a portion of the vertical portions of the fins and create thin spacers above the metal gates;

FIG. 6 is a cross-sectional view of the semiconductor device illustrating further etching of the dielectric layer in the VFET region and application of a hard mask over the dielectric layer in the VFET region;

FIG. 7 is a cross-sectional view of the semiconductor device illustrating deposition of a lightly doped drain in contact with the top surface of the fin in the LDMOS region; and FIG. 8 is a cross-sectional view of the semiconductor device illustrating the removal of the hard mask in the VFET region, followed by deposition of a heavily doped drains in contact with the fins of the VFET region and a heavily doped drain layer over the lightly doped drain in the LDMOS region.

DETAILED DESCRIPTION

Figure 1:
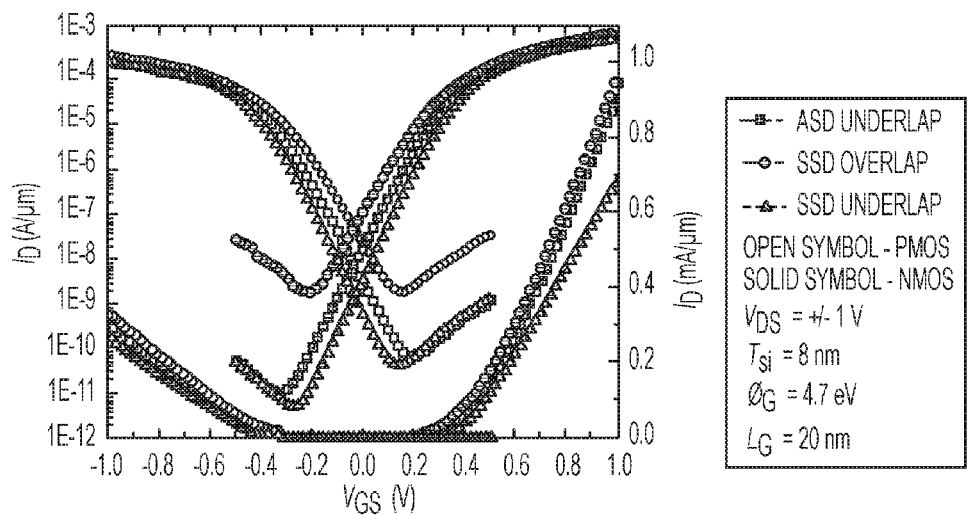
FIG. 1 is a graph of $I_D$ vs $V_{GS}$ characteristics of asymmetric drain (ASD) underlap, symmetric drain (SSD) overlap, and SSD underlap NMOS and PMOS devices.

It is understood in advance that, although embodiments of the invention include a detailed description of the formation of and resulting structures for a specific type of FET, implementation of the teachings recited herein are not limited to a particular type of semiconductor device or IC architecture. Rather embodiments of the present invention are capable of being implemented in conjunction with any other type semiconductor device or IC architecture, now known or later developed, as long as the semiconductor device incorporates the essential features described herein.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present invention to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s). In the following invention "front-side" refers to the surface on which the integrated circuit devices are made prior to flipping over the FET, and "back-side" refers to the surface that is to become the top surface after the device is turned over and bonded to a handling wafer.

The MOS transistor can include both a p-type device and an n-type device, wherein such a device is commonly referred to as a complementary MOS or CMOS device. A MOS transistor includes a gate electrode as a control electrode that is formed over a semiconductor layer having spaced-apart source and drain regions formed therein. Because of the higher density per unit area of microelectronic devices on a chip, it is a challenge to reduce the parasitic or unwanted capacitance between the gate conductor line and the metal filled vias that form the contacts to the device source and drain.

A vertical field effect transistor (VFET) has a channel perpendicular to the substrate surface, as opposed to being situated along the plane of the surface of the substrate. By using this design, it is possible to increase packing density.

That is, by having the channel perpendicular to the substrate surface, vertical FETs improve the scaling limit beyond planar fin-FETs.

However, vertical FETs are still severely challenged past the 7 nm node due to high aspect ratios, Vmax limits, and material thickness not scaling well. For example, insulator material and shared contacts formed between gate material of adjacent VFETs make it very difficult to scale the devices beyond the 7 nm node, basically due to material thickness, leakage concerns, breakdown voltage, decreased resistances and capacitance, among others. Accordingly these constraints make it very difficult to decrease gate pitch in current vertical FET designs.

There are further recognized advantages associated with transistors of the laterally diffused metal oxide semiconductor (LDMOS) type which have a highly resistive drain region to support high power and radio frequency applications. However, it has proven to be quite a challenge to provide an LDMOS which is compatible with FinFET devices. There is a need in the art for the integration of an LDMOS into a FinFET transistor.

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device includes drain and source regions and a gate electrode structure positioned above and between the source/drain regions. Upon application of an appropriate control voltage to the gate electrode, a conductive channel region forms between the drain region and the source region.

For many early device technology generations, the gate structures of most transistor elements (planar and FinFET devices) were formed from a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which can be associated with the use of traditional silicon-based materials in reduced channel length transistors. For example, in some aggressively scaled transistor elements, which can have channel lengths on the order of approximately 10-32 nm or less, gate structures that include a so-called high-k dielectric gate insulation layer (k-value of approximately 10 or greater) and one or more metal layers that function as the gate electrode have been implemented. Such alternative gate structures—typically known as high-k/metal gate structures (HK/MG structures)—have been shown to provide significantly enhanced operational characteristics over the heretofore more traditional silicon dioxide/polysilicon gate structure configurations.

The present device and methods are directed to integrating LDMOS technology on VFET technology that results in a broadening of VFET applications to power amplifiers. Specifically, the combined asymmetric underlapped drain enables high current and low subthreshold slope and LDMOS lightly doped drain to enable high drain resistance and high drain voltage.

The graph of FIG. 1 illustrates ID versus VGS characteristics of asymmetric drain (ASD) underlap, symmetric drain (SSD) overlap, and SSD underlap for NMOS and PMOS devices.

As shown in FIG. 1, ASD (asymmetric source/drain) devices, more specifically drain-side underlap and source-side overlap, demonstrated much-lower leakage current and similar drive current than SSD (symmetric source/drain) device, which are the typical devices used in current integrated circuits.

Figure 2:
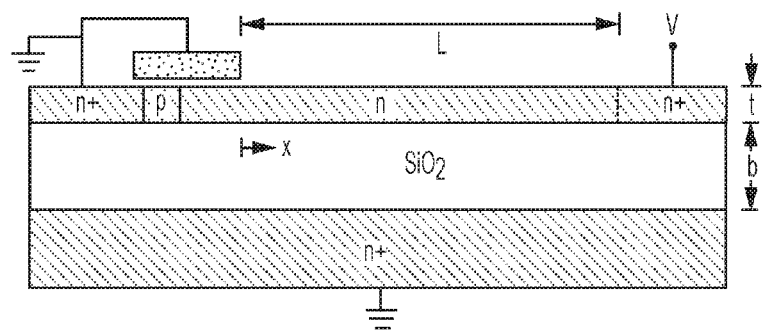
FIG. 2 is a schematic of a conventional SOI LDMOS transistor.

FIG. 2 illustrates a conventional SOI LDMOS transistor (image obtained from S. Merchant, Power Semiconductor Devices and ICs, 1993, ISPSD '93, Proceedings of the 5$^{th}$ International Symposium) illustrating lightly doped extended drain regions used to decrease $V_{ds}$, enabling increased $V_{dd}$ (approximately 10V in 1.2 V $V_{dd}$ technology. In applications where $V_{ds}$ is greater than 10 V, overlapped drains were designed to shorten effective channel length (to approximately 200 nm), enabling high current applications. Further, underlap is desired in VFET applications due to conventionally short channel lengths (approximately 20 nm).

In contrast, the present device and methods can include $V_{ds}$=1.8V and $V_{dd}$=0.8V. To enable this, a lightly doped drain area is added with a heavily doped region on top to reduce contact resistance.

Figure 3:
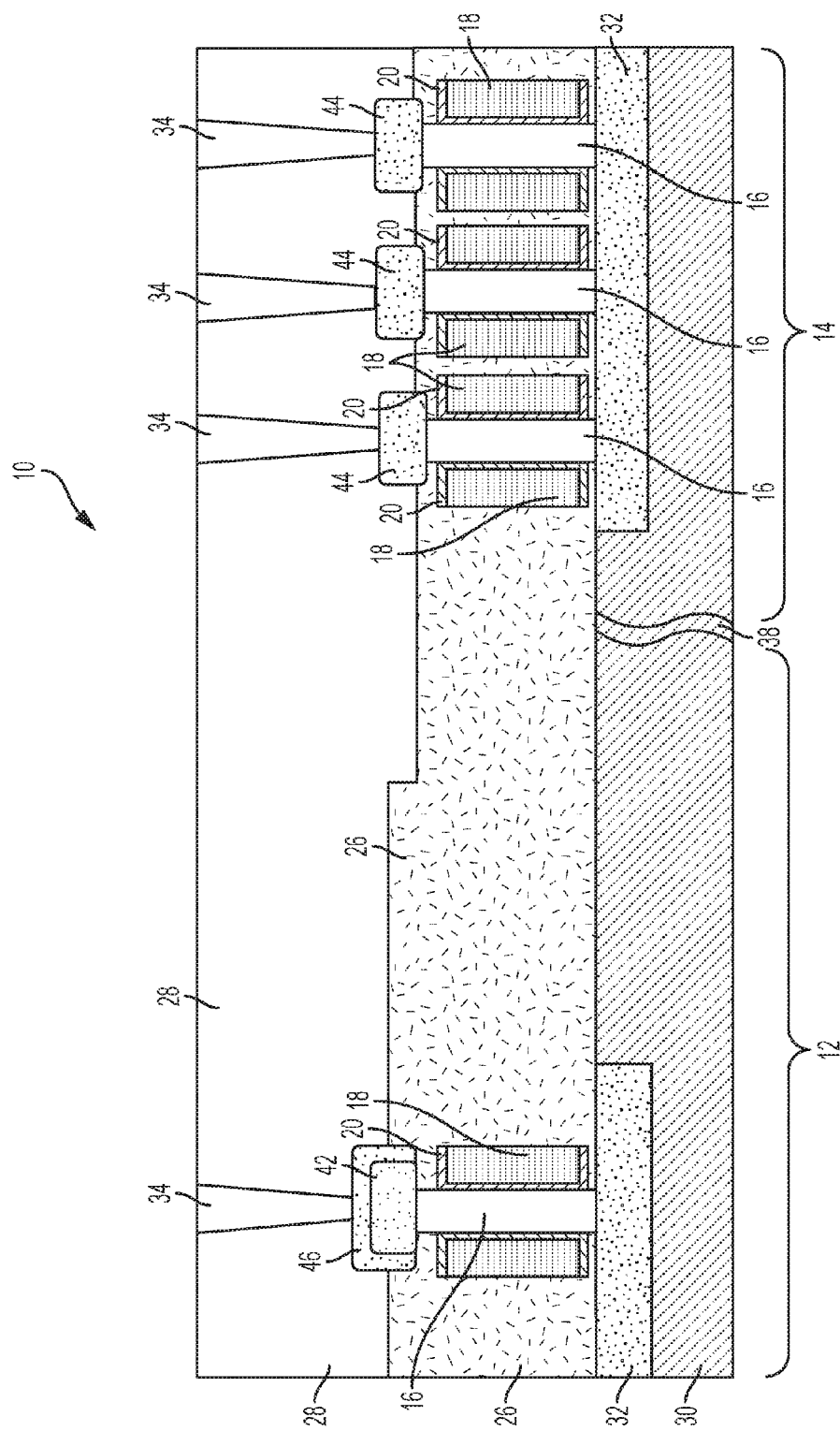
FIG. 3 illustrates a semiconductor device according to an embodiment.

FIG. 3 illustrates a cross section of the semiconductor device 10 including a LDMOS region 12 and a VFET region 14. Both regions include fins 16 having adjacent metal gates 18 in a first dielectric layer 26 extending from a substrate 30. The substrate 30 includes a source 32 in both regions in contact with the fins 16. In an example, a coating 20 separates the metal gate 18 from the fin 16. The LDMOS region 12 includes a lightly doped drain 42 in contact with a top surface of the fin 16, wherein the lightly doped drain 42 is coated with a heavily doped drain material 46. The VFET region 14 includes heavily doped drains 44 in contact with the top surfaces of the fins 16. The semiconductor device 10 also includes a second dielectric layer 28 extending from the first dielectric layer 26, wherein the second dielectric layer includes contacts 34 from the doped drains to a top surface of the semiconductor device 10.

Lightly doped drain 42 refers to doping levels wherein the count of the doping material in the epitaxy silicon is from 1e18 1/cm$^3$ to 1e19 1/cm$^3$. The doping can be achieved though in-situ doping during epitaxy growth of drain material. For NMOS, the drain dopant can include phosphorus, arsenic, and combinations thereof. For PMOS, the drain dopant can include boron.

Heavily doped drain 44 refers to doping concentrations wherein the count of the doping material in the epitaxy silicon is at least 1e20 1/cm$^3$. The doping can be achieved for the VFET region using in-situ doping during epitaxy growth of drain material. For NMOS, the drain dopant can include phosphorus, arsenic, and combinations thereof. For PMOS, the drain dopant can include boron.

The VFETs can be manufactured in a number of ways using a number of different tools. In general, the methodologies and tools are used to form structures with dimensions in the micrometer and nanometer scale. The methodologies and technologies employed to manufacture the VFETs have been adopted from integrated circuit technology. For example, the vertical FETs are built on wafers and are realized in films of material patterned by photolithographic processes on the top of the wafer. In particular, the fabrication of the vertical FETs use the following building blocks: deposition of thin films of material on a substrate, applying a patterned mask on top of the films by photolithographic imaging, and etching the films selectively to the mask.

For example, a beginning structure can include a substrate and an insulator layer formed thereon. The fins 16 can be formed on the insulator layer using conventional lithography and etching steps. The insulator layer can be a buried oxide layer (BOX) and the fins 16 can be formed from silicon on insulator material (e.g., SOI) or any semiconductor material including, but not limited to, Si, SiGe, SiGeC, SiC, Ge alloys, GaAs, InAs, InP, and other III/V or II/VI compound semiconductors.

Figure 4:
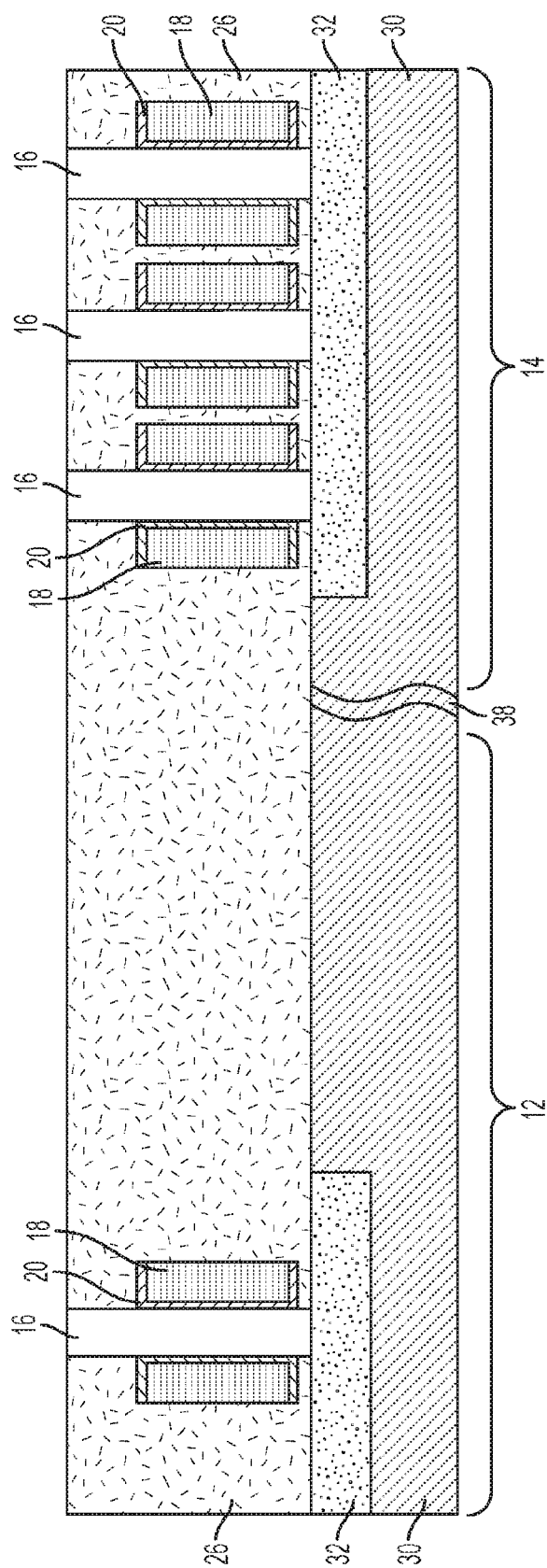
Figure 5:
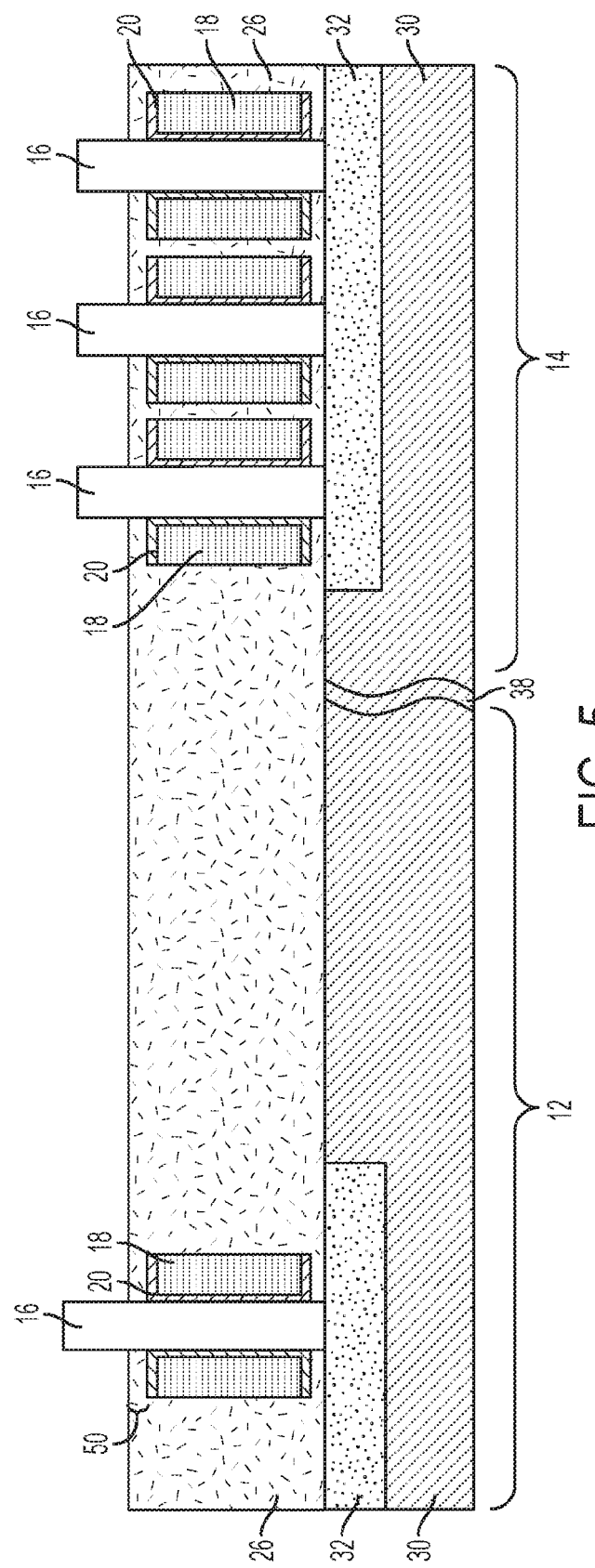

By way of example of forming the fins 16, a hard mask layer (for example, of silicon nitride SiN) can be deposited on the substrate. Over the hard mask layer, a lithographically patterned mask can be formed on the hard mask layer. The mask can include a number of mask openings with the lithographic patterning leaving mask material at locations where fins are desired. An etching operation can then be performed through the openings to define a plurality of apertures in the top surface of the substrate which define the fins. The lithographically patterned mask can then be removed. A dielectric material can then be deposited to fill the apertures. An upper portion of the dielectric material can then be removed through a recessing operation to expose the remaining portions of the hard mask layer. The remaining portions of the hard mask layer can then be stripped away, as shown in FIG. 4. The upper portion of the remaining dielectric material can then be partially recessed to expose the upper portions of the fins 16, as shown in FIG. 5.

The first dielectric material 26 can be used as a bottom spacer and can ensure that a later formed source or drain portion formed at this wider portion of the fin will not short to a gate structure. The dielectric material 26 can be an oxide material, which can be blanket deposited over the fins 16 and on any exposed surfaces of the structure by using a conventional deposition process. For example, the deposition process can be a chemical vapor deposition (CVD) process.

The semiconductor device 10 can be divided into a number of different regions. FIG. 3 illustrates the provision of a laterally diffused metal oxide semiconductor (LDMOS) region 12 including a fin 16 or plurality of fins 16 and a vertical FinFET (VFET) region 14 including a fin 16 or plurality of fins 16.

Depending on substrate type and configuration, as well as the circuit application, an isolation structure 38 can be required to separate the LDMOS region 12 from the VFET region 14. The isolation structure 38 can, for example, include a dielectric that forms a shallow trench isolation (STI) region, as well known to those skilled in the art.

In FIG. 3, a gate dielectric material 20 and a gate material 18 are formed on both sides of the fins 16. The gate dielectric material 20 can be a high-k material such as a hafnium based material, e.g., hafnium oxide. The gate material 18 can be any appropriate metal material or combinations of metal materials, depending on the desired work function properties. The gate dielectric material 20 and the gate material 18 can have a thickness of about 5 nm or less, and wrap around the entire exposed vertical surfaces of the fins 16, on top of the gate material 18. The gate dielectric material 20 and the gate material 18 can be formed by a conventional deposition process, e.g., CVD, followed by a recessing process such that the vertical extents of the fins 16 are exposed. The recess process can be a chemical mechanical process (CMP), which exposes a top surface of the fin 16 followed by an etch back process.

As shown in FIG. 4, the fins 16 and gate structures are positioned within a first dielectric material 26. The first dielectric material 26 can be an oxide material, acting as isolation structures between the fins 16 and gates 18, as well as separating a later formed source or drain region from the gate structure. The first dielectric material 26 can be formed by a conventional deposition process (e.g., CVD), followed by a planarization process. The planarization process will expose top surfaces of the fins 16.

Figure 6:
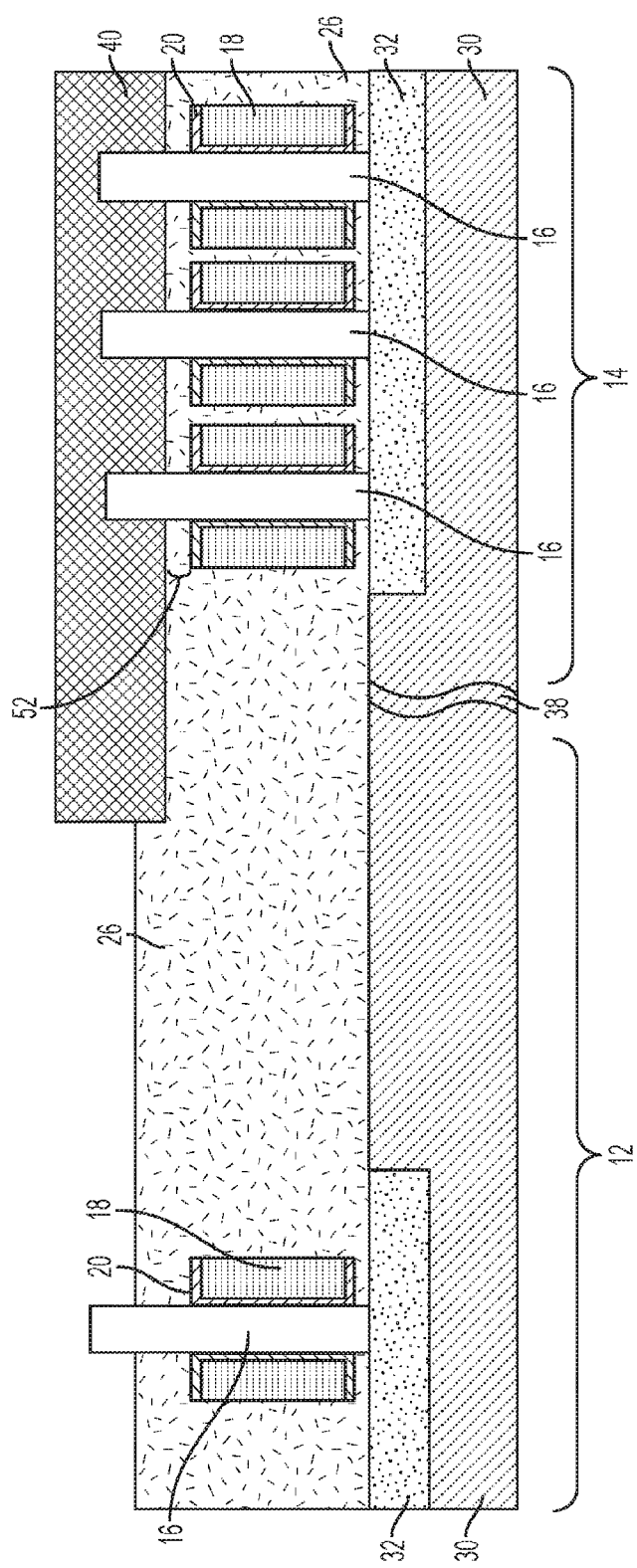

As shown in FIG. 5, the first dielectric material 26 can be etched back to create a first thin spacer 50 above the metal gates 18 in both the LDMOS region 12 and the VFET region 14. As shown in FIG. 6, the first dielectric layer 26 is further etched back in the VFET region 14 creating a second thin spacer 52 above the metal gates 18 in the VFET region 14. As such, the second thin spacer 52 positioned above the metal gates 18 in the VFET region 14 is thinner than the first thin spacer 50 above the metal gates 18 in the LDMOS region 12. After the additional etching back of the first dielectric material 26 in the VFET region 14, a hard mask 40 is applied over the first dielectric material 26 and the exposed upper portion of the fins 16 of the VFET region 14.

Figure 7:
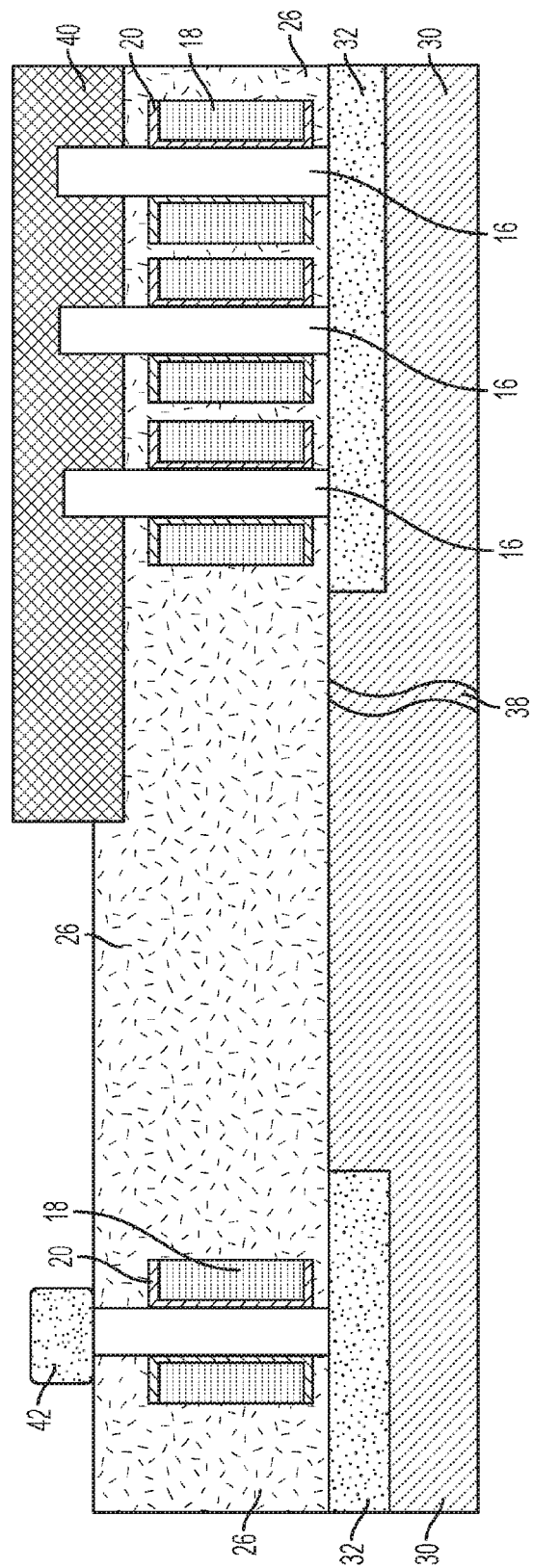

As shown in FIG. 7, a lightly doped drain 42 is formed in contact with the exposed top surface of the fin 16 in the LDMOS region 12. The lightly doped drain can be formed by an epitaxial growth process.

Figure 8:
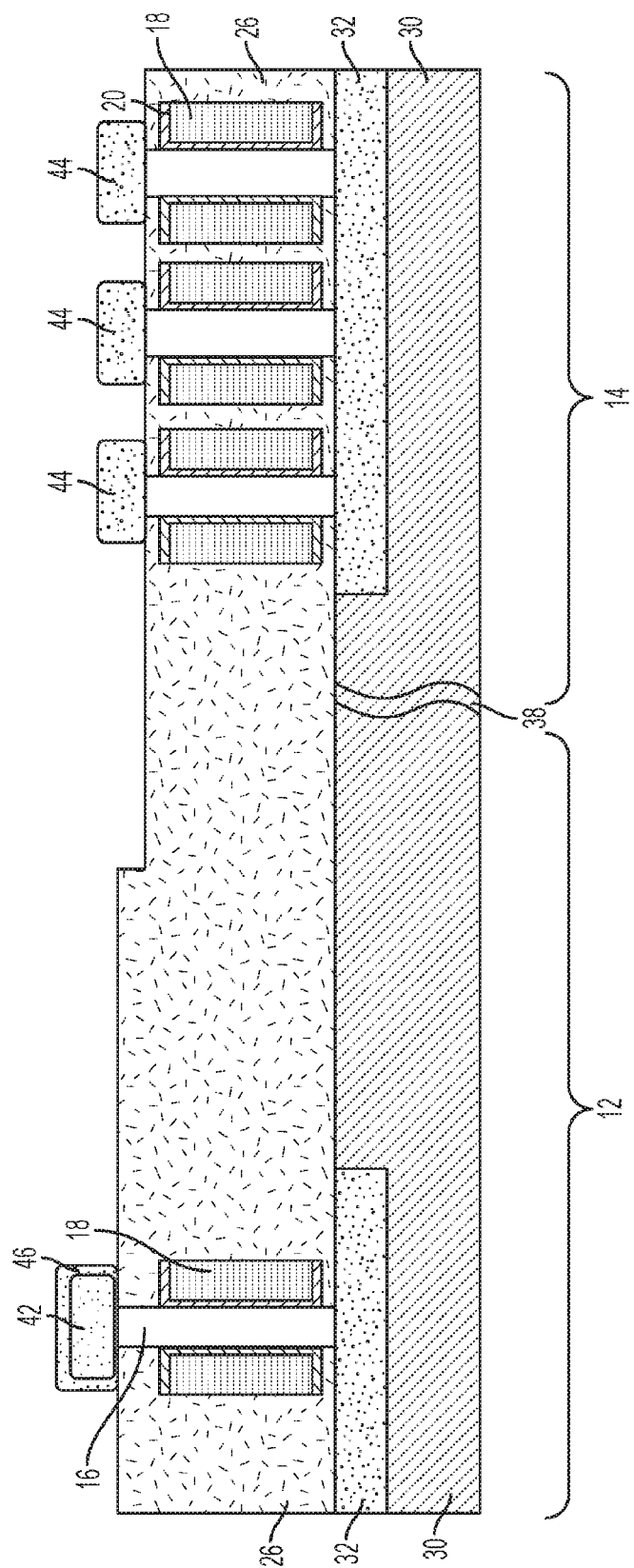

As shown in FIG. 8, the hard mask 40 is removed from the VFET region, and heavily doped drains 44 are formed on the top surfaces of the exposed fins 16 in the VFET region 14. In addition, a heavily doped drain coating 46 can be formed over the lightly doped drain 42 in the LDMOS region 12. The epitaxial growth can include, for example: silicon highly doped with boron or indium; silicon-germanium highly doped with boron or indium; silicon highly doped with phosphorous or arsenic; or silicon-carbide highly doped with phosphorous or arsenic. In this context, highly doped means a doping concentration of $1 \times 10^{20}$ to $1 \times 10^{21}$ cm$^{-3}$. It will be understood that different regions of the substrate can utilize different materials for the epitaxial growth to account for, for example, the need to make transistors of the n-channel or p-channel type.

As shown in FIG. 3, a second dielectric material 28 can be deposited over the first dielectric layer 26 and heavily doped drains 44, 46 and planarized. Contact openings 34 can be formed in the second dielectric material 28 in order to form silicide regions on the source and drain contact regions of the gate structure. The openings can be formed by conventional lithography and etching processes, e.g., reactive ion etching processes. The silicide regions can be formed by a platinum silicide process although cobalt and nickel silicide processes are also contemplated.

The contacts 34 can be formed by a metal deposition process, in direct electrical contact with the respective silicide regions and on metal gate material deposited on the gate structure. The contacts 34 can be formed by a metal deposition process, with liner material. For example, the contacts can be tungsten or copper or alloys thereof, with the liner material being TiN or TaN; although other materials are also contemplated by the present invention. The metal material can be formed by conventional deposition process, e.g., CVD, followed by planarization process to remove any excessive material from the surface of the dielectric material.

Deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others.

For the sake of brevity, conventional techniques related to semiconductor device and IC fabrication cannot be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps have only been mentioned briefly herein or have omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the present embodiments of the invention utilize a variety of individually known physical and chemical processes performed on a semiconductor (e.g., silicon) substrate, some of which are described in the following immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device, the method comprising:
    forming a first fin and a second fin in a dielectric layer, wherein the first fin is in contact with a first metal gate and the second fin is in contact with a second metal gate, wherein each fin contacts a source region;
    etching the dielectric layer to create a first spacer above the first metal gate, the first spacer being in direct physical contact with the first fin over a first maximum distance along a thickness direction of the dielectric layer, and a second spacer above the second metal gate, the second spacer being in direct physical contact with the second fin over a second maximum distance along the thickness direction of the dielectric layer, wherein the first maximum distance is greater than the second maximum distance;
    applying a hard mask to the second fin;
    forming a lightly doped drain region in contact with the first fin;
    removing the hard mask to expose a surface of the second fin; and
    forming a heavily doped drain region in contact with the second fin.

2. The method of claim 1, further comprising coating the lightly doped drain region with a highly doped drain material.

3. The method of claim 1, further comprising applying a second dielectric layer to cover the lightly doped drain region and the heavily doped drain region, and forming, in the second dielectric layer, a first contact between the lightly doped drain region and a top surface of the semiconductor device and a second contact between the heavily doped drain region and the top surface of the semiconductor device.

4. The method of claim 1, wherein the lightly doped drain region includes phosphorus, arsenic, or combinations thereof.

5. The method of claim 1, wherein the lightly doped drain region includes a doping material, wherein a concentration of the doping material is from 1e18 $1/cm^3$ to 1e19 $1/cm^3$.

6. The method of claim 1, wherein the heavily doped drain region includes boron, boron difluoride, or combinations thereof.

7. The method of claim 1, wherein the heavily doped drain region includes a doping material, wherein a concentration of the doping material is at least 1e20 $1/cm^3$.

8. The method of claim 1, wherein each of the first metal gate and the second metal gate includes $SiO_2$, hafnium oxide, TiN, TiAl, or combinations thereof.

9. The method of claim 1, further comprising a gate dielectric layer including a high-k dielectric material and $SiO_2$.

10. The method of claim 1, wherein the first maximum distance is at least 5 nm greater than the second maximum distance.

11. The method of claim 1, wherein the first maximum distance is at least 10 nm greater than the second maximum distance.

12. A method of fabricating a semiconductor device, the method comprising:
   forming a first fin and a second fin in a dielectric layer, wherein the first fin is in contact with a first gate dielectric material and the second fin is in contact with a second gate dielectric material, wherein the first gate dielectric material is in contact with a first metal gate and the second gate dielectric material is in contact with a second metal gate, wherein each fin contacts a source region;
   etching the dielectric layer to create a first spacer above the first gate dielectric material, the first spacer being in direct physical contact with the first fin over a first maximum distance along a thickness direction of the dielectric layer, and a second spacer above the second gate dielectric material, the second spacer being in direct physical contact with the second fin over a second maximum distance along the thickness direction of the dielectric layer, wherein the first maximum distance is greater than the second maximum distance;
   applying a hard mask to the second fin;
   forming a lightly doped drain region in contact with the first fin;
   removing the hard mask to expose a surface of the second fin; and
   forming a heavily doped drain region in contact with the second fin.

13. The method of claim 12, further comprising coating the lightly doped drain region with a highly doped drain material.

14. The method of claim 12, further comprising applying a second dielectric layer to cover the lightly doped drain region and the heavily doped drain region, and forming, in the second dielectric layer, a first contact between the lightly doped drain region and a top surface of the semiconductor device and a second contact between the heavily doped drain region and the top surface of the semiconductor device.

15. The method of claim 12, wherein the lightly doped drain region includes phosphorus, arsenic, or combinations thereof.

16. The method of claim 12, wherein the heavily doped drain region includes boron, boron difluoride, or combinations thereof.

17. The method of claim 12, wherein each of the first metal gate and the second metal gate includes $SiO_2$, hafnium oxide, TiN, TiAl, or combinations thereof.

18. The method of claim 12, wherein each of the first gate dielectric material and the second gate dielectric material includes a high-k dielectric material and $SiO_2$.

19. The method of claim 12, wherein the first maximum distance is at least 5 nm greater than the second maximum distance.

20. The method of claim 12, wherein the first spacer is above the first metal gate and the second spacer is above the second metal gate.

* * * * *